United States Patent
Fischer et al.

(10) Patent No.: US 10,054,785 B1
(45) Date of Patent: Aug. 21, 2018

(54) RESIST STRUCTURE OF AN ELECTROWETTING ELEMENT

(71) Applicant: Amazon Technologies, Inc., Seattle, WA (US)

(72) Inventors: Iren Fischer, Eindhoven (NL);
Romaric Mathieu Massard, Eindhoven (NL); Gerben Boon, Roermond (NL);
Bokke Johannes Feenstra, Nuenen (NL)

(73) Assignee: Amazon Technologies, Inc., Seattle, WA (US)

( * ) Notice: Subject to any disclaimer, the term of this patent is extended or adjusted under 35 U.S.C. 154(b) by 82 days.

(21) Appl. No.: 14/980,872

(22) Filed: Dec. 28, 2015

(51) Int. Cl.
*G02B 26/00* (2006.01)
*G02B 1/04* (2006.01)
*G03F 7/20* (2006.01)

(52) U.S. Cl.
CPC .............. *G02B 26/005* (2013.01); *G02B 1/04* (2013.01); *G03F 7/20* (2013.01)

(58) Field of Classification Search
CPC ...... G02B 26/005; G02B 1/04; G02B 26/004; G03F 7/20
USPC .................................................. 359/290–296
See application file for complete search history.

(56) References Cited

U.S. PATENT DOCUMENTS

| | | | | |
|---|---|---|---|---|
| 2006/0110580 A1* | 5/2006 | Aylward | ............... | G02B 26/004 428/172 |
| 2009/0002806 A1* | 1/2009 | Skipor | ................. | G02B 26/005 359/296 |
| 2010/0296149 A1* | 11/2010 | Feenstra | .............. | G02B 26/005 359/290 |
| 2012/0056081 A1* | 3/2012 | Kozodoy | ................... | F24J 2/06 250/227.25 |
| 2013/0017374 A1* | 1/2013 | Mionic | .................... | C08J 3/212 428/195.1 |

OTHER PUBLICATIONS

Thomas Hanemann et al. "Polymer-Nanoparticle Composites: From Synthesis to Modem Applications" published in Materials 2010 vol. 3, ISSN 1996-1944, www.mdpi.com/journal/materials pp. 3468-3517, May 28, 2010.
Damien M. Marquis et al. "Properties of Nanofillers in Polymer" published in Nanocomposites and Polymers with Analytical Methods, Chapter 11, ISBN 978-953-307-352-1 pp. 261-284, Aug. 9, 2011.

* cited by examiner

*Primary Examiner* — Joseph P Martinez
*Assistant Examiner* — Vipin Patel
(74) *Attorney, Agent, or Firm* — EIP US LLP (57) ABSTRACT

An electrowetting element comprises a first fluid and a second fluid immiscible with the first fluid. A first support plate comprises a first substrate; an electrode; and a layer in contact with at least one of the first fluid or the second fluid. A second support plate comprises a second substrate. One of the first support plate or the second support plate comprises a resist structure protruding in a direction towards the other one of the first support plate or the second support plate. The resist structure comprises a polymer nanocomposite material.

20 Claims, 4 Drawing Sheets

RESIST STRUCTURE OF AN ELECTROWETTING ELEMENT

BACKGROUND

Electrowetting display devices are known. In an example of a known electrowetting display device, a first and a second fluid, immiscible with each other, are confined between a first support plate and a second support plate. The first fluid is confined in picture elements, for example pixels, of such a device by walls.

Deformation of the first and second support plates relative to each other may cause unwanted effects. For example, pressure exerted on the second support plate, for example by a finger, may cause the second support plate to move towards the first support plate. If the distance between the support plates becomes small enough, the first fluid may adhere to the second support plate. This may be referred to as a "lowered ceiling effect". If a pressure pulse is exerted on the second support plate, a shock wave may be created, which may cause the first fluid to flow over a picture element wall. This may be referred to as a "tsunami effect".

It is desirable to improve a robustness of an electrowetting display device against deformation.

DETAILED DESCRIPTION

Examples will be described below in relation to a resist structure of at least one of a first support plate or a second support plate of an electrowetting element. A resist structure is for example an element, structure, formation or protrusion which for example extends, protrudes, juts out from, bulges, projects or is a swelling in an outwards direction from a surface. The resist structure may be patterned and may form a relief pattern raised out of a surface plane of a planar layer of the support plate.

The resist structure may for example be a wall, described in more detail below, or may in other examples be a spacer, again described further below. Such a spacer and a wall may contact each other, either without or upon deformation of the first and second support plates, to reduce deformation of the first and second support plates. In turn, this can reduce detrimental effects that such deformations may have on the electrowetting element (for example the so-called "lowered ceiling effect" and the "tsunami effect" described earlier). It is noted that such problems are specific to electrowetting technology. For example, in LCD display technology, there is one liquid crystal phase material between two support plates, and the dimensions of a liquid crystal filled cavity between the plates, is such that the "lowered ceiling effect" and "tsunami effect" problems are not a concern in LCD display technology.

As will be explained in more detail below, such a resist structure of examples comprises a polymer nanocomposite material. It has been realized that such a material can notably improve the stiffness of such a resist structure, to improve robustness of the electrowetting element. Further details and examples are described below.

Figure 1:
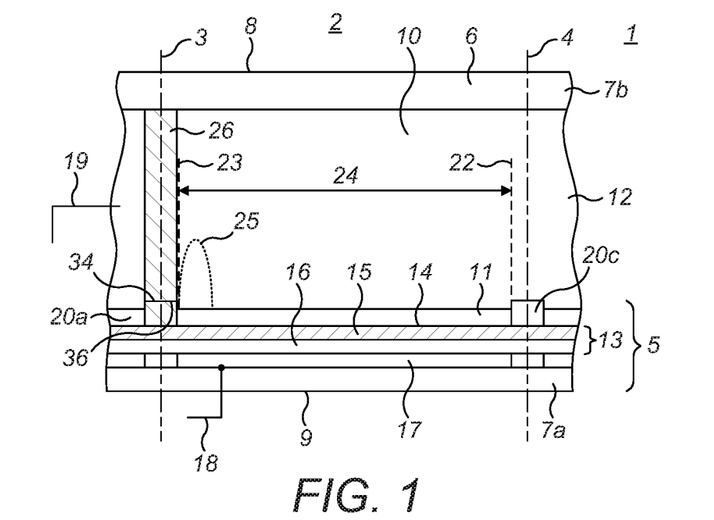
FIG. 1 shows schematically a cross-section of an electrowetting element according to examples.

FIG. 1 shows a diagrammatic cross-section of part of an example of an electrowetting display device 1, which may be referred to as a display device, including a plurality of picture elements or display elements 2, one of which is shown in the Figure and which may also be referred to as an electrowetting cell or electrowetting element. The lateral extent of the display element is indicated in the Figure by two dashed lines 3, 4. The display elements comprise a first support plate 5 and a second support plate 6. The support plates may be separate parts of each display element, but alternatively the support plates may be shared in common by the plurality of display elements. The support plates may each include a glass or polymer substrate (7a, 7b) and may be rigid or flexible.

It is to be noted that in describing features of examples, a structure (e.g. a layer or resist structure) may be interpreted as located or applied on another structure (e.g. a different layer such as an underlying layer). Use of the term on is to be understood to cover situations where the two structures is directly in contact with each other, and other situations where one structure is supported by and/or overlies the other structure, but with at least one intervening structure in between.

The display device has a viewing side 8 on which an image or display formed by the display device can be viewed and a rear side 9. In the Figure a surface of the first support plate 5, which surface is in this example a surface of a first substrate 7a, corresponds with the rear side 9; a surface of the second support plate 6 is of a second substrate 7b and corresponds with the viewing side 8; alternatively, in other examples, a surface of the first support plate may correspond the viewing side. The display device may be of the reflective, transmissive or transflective type. The display device may be an active matrix driven display device. The plurality of display elements may be monochrome. For a color display device the display elements may be divided in groups, each group having a different color; alternatively, an individual display element may be able to show different colors. For clarity, circuitry for controlling the display element is not illustrated, but it is to be appreciated that the first support plate may for example comprise further layers to form such circuitry, for example a thin film transistor (TFT).

A first fluid 11 and a second fluid 12 are positioned between the first 5 and second 6 support plates, in the space 10. At least one of the first and second fluids may be a liquid. The second fluid is immiscible with the first fluid. Therefore, the first fluid and the second fluid do not substantially mix with each other and in some examples do not mix with each other to any degree. The immiscibility of the first and second fluids is due to the properties of the first and second fluids, for example their chemical compositions; the first and second fluids tend to remain separated from each other, therefore tending not to mix together to form a homogeneous mixture of the first and second fluids. Due to this immiscibility, the first and second fluids meet each other at an interface which defines a boundary between the volume of the first fluid and the volume of the second fluid; this interface or boundary may be referred to as a meniscus. With the first and second fluids substantially not mixing with each other, it is envisaged in some examples that there may be some degree of mixing of the first and second fluids, but that this is considered negligible in that the majority of the volume of first fluid is not mixed with the majority of the volume of the second fluid.

The second fluid is electrically conductive or polar and may be water, or a salt solution such as a solution of potassium chloride in water. The second fluid may be transparent; it may instead be colored, absorbing. The first fluid is electrically non-conductive and may for instance be an alkane like hexadecane or may be an oil such as silicone oil.

The first fluid may absorb at least a part of the optical spectrum. The first fluid may be transmissive for a part of the optical spectrum, forming a color filter. For this purpose the first fluid may be colored by addition of pigment particles or a dye. Alternatively, the first fluid may be black, for example by absorbing substantially all parts of the optical spectrum, or reflecting. A reflective first fluid may reflect the entire visible spectrum, making the layer appear white, or part of it, making it have a color. In examples to be described below, the first fluid is black and therefore absorbs substantially all parts of the optical spectrum, for example in the visible light spectrum. Typically, the phrase substantially absorbs includes a degree of variation, therefore the first fluid may not absorb all wavelengths, but the majority of wavelengths within a given spectrum such as the visible spectrum, so as to perform the function of the first fluid in the element. The first fluid is therefore configured to absorb substantially all light incident on the first fluid. For example the first fluid may absorb 90% or more of light in the visible spectrum and incident on the first fluid.

The support plate 5 includes an insulating layer 13. The insulating layer may be transparent or reflective. The insulating layer 13 may extend between walls of a display element; the walls are described below. To avoid short circuits between the second fluid 12 and electrodes arranged under the insulating layer, layers of the insulating layer may extend uninterrupted over a plurality of display elements 2, as shown in the Figure. The insulating layer has a surface 14 facing the space 10 of the display element 2. In this example the surface 14 is hydrophobic. The thickness of the insulating layer may be less than 2 micrometers and may be less than 1 micrometer.

The insulating layer may be a hydrophobic layer; alternatively, it may include a hydrophobic layer 15 and a barrier layer 16 with predetermined dielectric properties, the hydrophobic layer 15 facing the space 10, as shown in the Figure. The hydrophobic layer is schematically illustrated in FIG. 1 and may be formed of Teflon® AF1600. The barrier layer 16 may have a thickness, taken in a direction perpendicular the plane of the substrate, between 50 nanometers and 500 nanometers and may be made of an inorganic material like silicon oxide or silicon nitride.

The hydrophobic character of the surface 14 causes the first fluid 11 to adhere preferentially to the insulating layer 13, since the first fluid has a higher wettability with respect to the surface of the insulating layer 13 than the second fluid 12. Wettability relates to the relative affinity of a fluid for the surface of a solid. Wettability may be measured by the contact angle between the fluid and the surface of the solid. The contact angle is determined by the difference in surface tension between the fluid and the solid at the fluid-solid boundary. For example, a high difference in surface tension can indicate hydrophobic properties.

Each display element 2 includes a first electrode 17 as part of the first support plate 5. In examples shown there is one such electrode 17 per element. The electrode 17 is electrically insulated from the first and second fluids by the insulating layer 13; electrodes of neighboring display elements are separated by a non-conducting layer. In some examples, further layers may be arranged between the insulating layer 13 and the electrode 17. The electrode 17 can be of any desired shape or form. In examples, each display element 2 may include more than one such electrode as part of the support plate 5. The electrode 17 of a display element is supplied with voltage signals by a signal line 18, schematically indicated in the Figure.

A second signal line 19 is connected to an electrode that is in contact with the conductive second fluid 12. This electrode may be common to all elements, when they are fluidly interconnected by and share the second fluid. The display element 2 can be controlled by a voltage V applied between the signal lines 18 and 19. The electrodes 17 on the substrate 7a are coupled to a display control apparatus. In a display device having the picture elements arranged in a matrix form, the electrodes can be coupled to a matrix of control lines on the substrate 7a.

The first fluid 11 in this example is surrounded, for example to at least partially confine the first fluid to a display element, by walls that follow the cross-section of the display element. Thus, the walls bound a perimeter of the surface 14 of the layer of the first support plate in contact with at least one of the first or second fluids, depending on a configuration of the fluids. The walls are described in more detail below. The extent of the display element, indicated by the dashed lines 3 and 4, is indicated by the center of the walls. The area of the surface 14 between the walls of a display element, indicated by the dashed lines 22 and 23, may be considered a display area 24, over which a display effect occurs and which is in contact with at least one of the first or second fluids. The display effect depends on an extent that the first and second fluids adjoin the surface corresponding to the display area, in dependence on the magnitude of the applied voltage V described above. The magnitude of the applied voltage V therefore determines the configuration of the first and second fluids within the electrowetting element. In other words, the display effect depends on the configuration of the first and second fluid in the display element, which configuration depends on the magnitude of the voltage applied to the electrodes of the display element. The display effect gives rise to a display state of the display element for an observer looking at the display device. Upon switching the electrowetting element from one fluid configuration to a different fluid configuration the extent of second fluid adjoining the display area surface may increase or decrease, with the extent of first fluid adjoining the display area surface decreasing or increasing, respectively.

In examples described herein, the first fluid 11 adjoins at least part of the display area 24. When a zero or substantially zero voltage is applied between the electrodes, for example when the electrowetting element is in an off state, the first fluid 11 forms a layer between the walls, as shown in FIG. 1. The layer is shown in FIG. 1 as having a height less than the height of the wall, but in other examples the layer may have the same or similar height as the wall. Application of a voltage will contract the first fluid, for example against a wall as shown by the dashed shape 25 in FIG. 1. The controllable shape of the first fluid, in dependence on the magnitude of applied voltage, is used to operate the picture element as a light valve, providing a display effect over the display area 24. For example, switching the fluids to increase adjoinment of the second fluid 12 with the display area 24 may increase the brightness of the display effect provided by the element.

This display effect determines the display state an observer will see when looking towards the viewing side of the display device. The display state can be from black to white with any intermediate grey state; in a color display device, the display state may also include color.

The second support plate 6 includes at least one spacer 26 protruding from the second support plate 6 in a direction towards the first support plate 5. For example, where a part of the second support plate is closer to the first support plate than a different part of the second support plate, the closer part of the second support plate may be considered to protrude from the second support plate and therefore form the spacer. For example, the part of the second support plate forming the spacer may have a greater height than the different part of the second support plate, a height of the spacer being taken in a direction perpendicular to a plane of the display area 24. The spacer 26 may be used to reduce the lowered ceiling and/or tsunami effects, as will be described below. The spacer therefore is for example formed to at least partly space a planar surface of the first support plate (e.g. the display area) from a planar surface of the second support plate.

Figure 2:
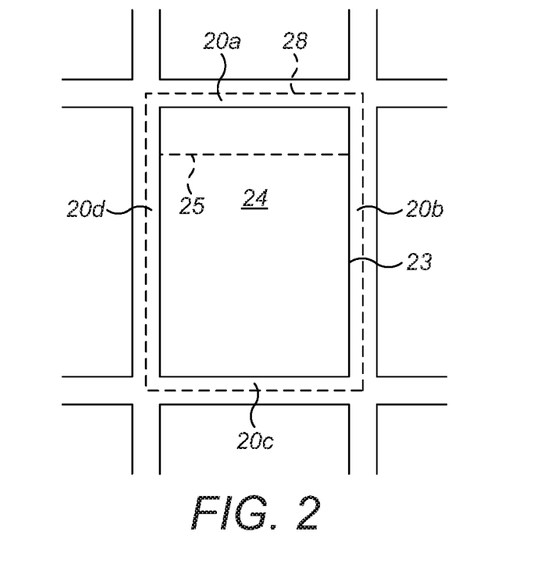
FIG. 2 shows schematically a plan view of the electrowetting element according to examples.

FIG. 2 shows a plan view of an example array of electrowetting picture elements including the picture element of FIG. 1. The lateral extent of the picture element of FIG. 1, corresponding to the dashed lines 3 and 4 in FIG. 1, is indicated in FIG. 2 by the dashed line 28.

As shown in FIGS. 1 and 2, the first support plate 5 includes a first display area 24, with a first wall 20*a* positioned along a first side of the first display area 24. The first display area 24 is surrounded by the first wall 20*a* and three other walls 20*b*, 20*c*, 20*d*. It may be considered that such four walls together form a single continuous wall surrounding, in other words bounding a perimeter of, the display area 24; in this case the walls 20*a*, 20*b*, 20*c* and 20*d* may each be considered as a wall portion of the single continuous wall.

The spacer 26 in examples such as that of FIG. 1 contact a surface of the first wall 20*a*. It is to be appreciated that the spacer 26 in some examples may be circular in cross section (e.g. in the plane of FIG. 2) but in other examples may be differently shaped. For example the spacer may instead form a grid-shaped protrusion from the second support plate which contacts a surface of all walls surrounding a display area of a picture element.

FIG. 1 shows one spacer 26 but in other examples there may be more than one spacer protruding from the second support plate, which for example contact a respective surface of multiple walls surrounding the same display area of one picture element. Such more than one spacer may for example be regularly positioned across an array of picture elements, for example at each corner of a picture element when viewed in plan view. Thus, a spacer may be positioned where at least two walls along different sides of a display area meet.

In order that a spacer can contact a surface of a wall, the spacer may be considered to overlap or cover a surface of the wall.

As explained above, at least one of the first support plate or the second support plate comprises a resist structure. The resist structure protrudes in a direction towards the other one of the first support plate or the second support plate. Therefore, for example, where the resist structure is a spacer, such as that labelled 26 in FIG. 1, the resist structure protrudes for example from the second support plate towards the first support plate. The spacer may contact the first support plate, for example a surface of a wall. In other examples, the resist structure may be a wall, such as the wall labelled 20*a* and described above, which protrudes from the first support plate and bounds a perimeter of a first support plate surface (e.g. corresponding with the display area 24) in contact with at least one of the first fluid or the second fluid. In some examples, it is envisaged that such a wall may extend towards and contact the second support plate. In this way, such a wall may function as a spacer as well as a wall. In further examples, an electrowetting element may have two resist structures; one is a spacer and one is a wall contacting the spacer, for example as illustrated in relation to FIG. 1.

It has been found that using a polymer nanocomposite material to at least partly form a resist structure such as a spacer or a wall enables a more robust electrowetting element to be constructed.

A polymer nanocomposite material is typically a material having a polymer base material with a so-called nano-material dispersed therein. In examples a polymer is a molecule formed of a plurality of repeating monomer molecules as the skilled person will understand, for example linked together to form a backbone of the polymer molecule. As will be appreciated by the skilled person, the repeating monomer molecules may not all be the same; for example the organic compound may be a co-polymer comprising a repetition of two or more different monomer molecules in an arbitrary ratio. In examples, the organic material comprises a plurality of polymer molecules which together may form an amorphous solid material; the term amorphous is considered to mean that a material is substantially, for example predominantly, or entirely, non-crystalline. A non-crystalline material for example has no crystalline structures, or is not predominantly crystalline, a crystalline structure having a regular structure, for example with an ordered arrangement of atoms therein, which for example are arranged as a two dimensional or three dimensional lattice. In other examples, the organic material may comprise a polymer with a substantially (for example predominantly, or entirely) crystalline structure, which for example has an ordered arrangement of molecule chains, such as folded chains. In further examples the material may be a semi-crystalline material.

For example, a polymer may in some examples be an organic compound, and in other examples an inorganic compound or a hybrid compound when formed of organic and inorganic molecular components. An organic material is typically any material or compound which comprises a carbon atom bonded to a hydrogen atom, i.e. a C—H bond. In contrast, an inorganic material is, in examples, any material or compound which is not organic. Therefore, an inorganic material or compound may not include carbon or may not include a carbon atom bonded to a hydrogen atom (i.e. a C—H bond). An inorganic material may for example be a crystalline material, or may be amorphous. An inorganic material may be considered to comprise atoms which form one or more lattices, for example, with a structure which is crystalline or amorphous.

A so-called nano-material is typically a material with a unit structure having at least one dimension of less than 100 nanometers (nm). For example, such a unit structure may be a so-called one dimensional nano-object (e.g. with a plate, shell or laminar form), a so-called two dimensional nano-object (e.g. with a rod, tube or fiber form), or a so-called three dimensional nano-object (e.g. with an iso-dimensional form, such as a bead or sphere shape).

A polymer nanocomposite material may therefore be considered to be a composite material of a polymer material and a nano-material. A composite is for example a material formed of a mixture or blend of different materials which may be physically mixed with each other, rather than having chemically reacted with each other. The nano-material may for example be considered to be a nano-filler, which may be dispersed in the polymer, for example to at least partially fill voids between a matrix of polymeric molecular chains of the polymer. By dispersed it is generally understood that the nano-material may be approximately uniformly distributed throughout at least a portion of the polymeric matrix. For example, an average quantity of nano-filler per unit volume may be the same throughout the material. In other examples there may be regions within the composite with a higher concentration of nano-material than other regions.

A polymer nanocomposite material may for example be considered to be a multiphase solid material, with a polymeric phase and a nano-material phase. As explained above, the nano-material may comprise any of so-called one, two or three dimensional nano-objects. The polymer nanocomposite material may comprise one type or a mixture of different types of nano-particles.

With a nano-material dispersed in a polymeric material, at least one property of the polymeric material may be modified by the presence of the nano-material. It is this realization that has led to incorporation of a polymer nanocomposite material in a resist structure described herein. Indeed, it is not a trivial matter to identify a suitable material for part of an electrowetting element; such a material needs to meet many specific technical requirements. These include for example any of: a suitable stability in an electric field, a suitable wettability in respect of at least one of the first fluid or the second fluid, optically transparent to visible light, and suitable mechanical properties. It has now been found that a polymer nanocomposite material offers desirable properties for an electrowetting element, particularly for a resist structure such as a spacer or a wall.

More specifically, it has been realized that the mechanical properties of a resist structure such as a spacer or a wall can be modified and improved using a polymer nanocomposite material. For example, as explained above with reference to FIG. 1, a spacer may contact a wall and may function to reduce deformation of the electrowetting element. For example, a displacement of the two support plates towards each other may be reduced by forming such a resist structure at least partially of a polymer nanocomposite material, meaning undesirable effects such as the so-called lowered ceiling effect and/or tsunami effect may be avoided or reduced in likelihood.

The properties of such a resist structure may be tuned in dependence on for example any of: the specific chemical composition of the nano-material or nano-filler dispersed in the polymer, the polymer material, a suitable inertness to the first fluid and the second fluid compositions, an extent of cross-linking within the polymeric matrix, the concentration of the nano-filler in the polymer material, the shape or form of nano-objects in the nano-filler, a technique used for forming the resist structure, the specific composition of the material forming the resist structure, a degree of homogeneity of dispersing the nano-filler throughout the polymer material, an orientation of nano-objects within the resist structure, or a shape and/or size of the resist structure.

Therefore, to improve a robustness of an electrowetting element, to reduce deformation of the support plates and therefore reduce the so-called lowered ceiling effect and/or tsunami effect, a polymer nanocomposite material can be used to increase a stiffness of a resist structure. For example, compared with known electrowetting elements with a spacer and/or wall formed of a material without a nano-material dispersed therein, a resist structure comprising the polymer nanocomposite material may be up to three times, up to five times or up to ten times stiffer.

More specific examples will now be described.

In examples, a resist structure such as the spacer and/or the wall of FIG. 1, may comprise a polymer nanocomposite material comprising a nano-filler material dispersed in a photoresist polymer. In other words the polymeric matrix comprises a photoresist polymer. Typically a photoresist is a material which can be selectively hardened using radiation of one or more selected wavelengths. Depending on whether the photoresist is of a negative or positive type, the part exposed to radiation is either respectively strengthened or weakened against the later developing step of the lithography process.

In some examples, the photoresist polymer is an epoxy resin as is well known to the skilled in the art. An example of such a photoresist polymer is SU-8 photoresist which is well known to the skilled person, or KMPR photoresist available from MicroChem; these photoresist materials have been found to offer suitable properties for a resist structure of an electrowetting element. It is envisaged in other examples that a different polymer may be used, which may be a photoresist different from SU-8 or KMPR, and/or which may be patterned differently, without using exposure to light. Hence such a polymer may not necessarily be a photoresist.

A nano-filler may be dispersed in the polymer by for example mixing or agitating (e.g. using ultrasound) the nano-filler appropriately. In some examples, the polymer nanocomposite material comprises 30 to 90% by volume of nano-filler material.

A range of nano-filler materials may be dispersed in the polymer of a polymeric nanocomposite material. For example, one or more of the following may be dispersed: a nano metal oxide, titanium dioxide, nanosilica, nanoalumina, nanozirconia, carbon nanotubes, nanoclays, a phyllosilicate, a polysilicate, nanosilver, nanozinc, or nanogold. It is noted that the term nano typically means that at least one dimension of a nano-object of such a nano-material is less than 100 nanometers. For example, a nano-object such as a rod of nanosilica has at least one dimension of less than 100 nanometers. Other dimensions may be greater than 100 nanometers, for example up to 150 nanometers. At least one dimension may be as small as 5 nanometers. Therefore, at least one dimension may be in the range of 5 to 100 nanometers, and another dimension may be in the range 5 to 150 nanometers.

In specific examples, the polymer nanocomposite material comprises a nano-filler material of elongate nano-particles dispersed in the polymer. A nano-particle may otherwise be referred to as a nano-object, and therefore refers to a unit structure from which larger structures may be assembled. The term particle therefore does not refer to an atom particle, for example.

An elongate nano-particle is for example a nano-rod, a nano-tube, a nano-fiber, or any other unit structure with an elongate shape. Graphene may be used in some examples. In other examples a quantum dot may be used. Typically an elongate shape has a length which is greater than both a height and a width dimension of the shape. Thus, an elongate shape is for example longitudinal in form. Thus, such elongate shaped nano-particles may be referred to as a two dimensional nano-object. An elongate nano-particle therefore has a longitudinal axis along its length.

In examples, with the polymer nanocomposite material comprising elongate nano-particles, the elongate nano-particles are generally aligned with the respective longitudinal axis of each of the elongate nano-particles. Therefore, the longitudinal axis of one elongate nano-particle is generally more or less parallel with the longitudinal axis of at least some of the other elongate nano-particles. It is to be appreciated that given manufacturing limitations and stereochemical effects for example, it may not be the case that all or substantially all (e.g. 90% or more) of the elongate nano-particles are aligned with each other in respect of their longitudinal axes. However, such alignment may be such that the elongate nano-particles are generally aligned, for example where 50% or more, for example 60% or more, 70% or more, 80% or more, 85% or more, 90% or more, 95% or more, 98% or more, approximately 100% (within acceptable measuring accuracies) or 100% are aligned with each in respect of their longitudinal axes. This may be measured using for example analyzing a cross-section of the resist structure with for example electron microscopy.

Figure 3:
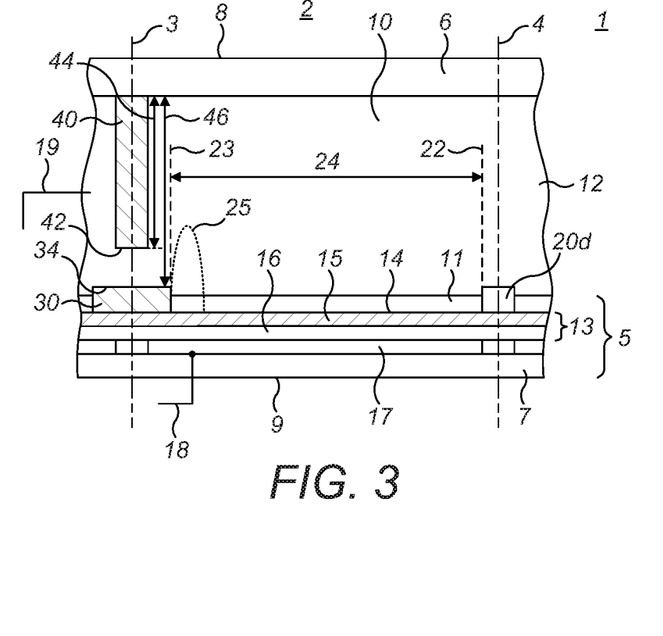
FIG. 3 shows schematically a cross-section of an electrowetting element according to further examples.
Figure 4:
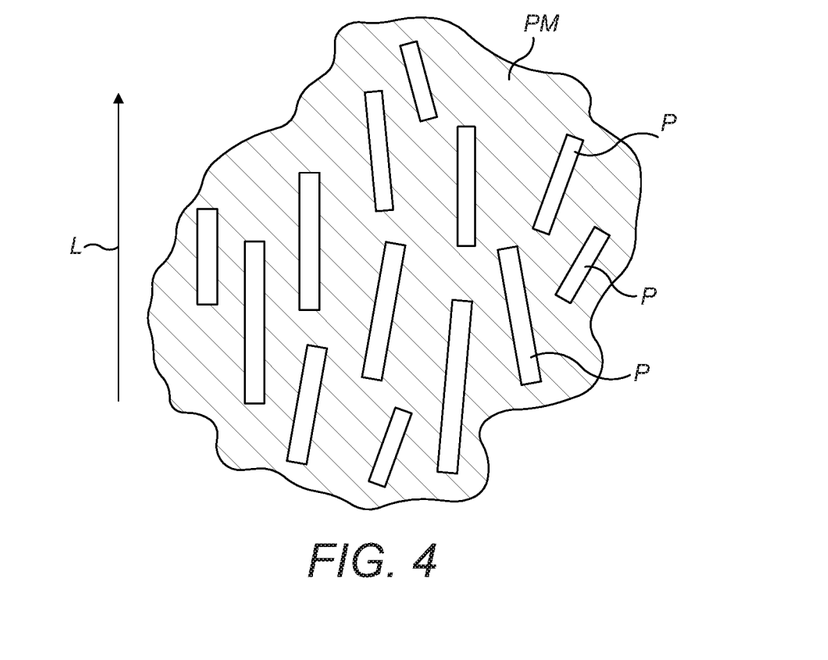
FIG. 4 illustrates schematically a polymer nanocomposite material in accordance with examples.

FIG. 4 shows schematically an example of a polymer nanocomposite material with a polymeric matrix PM with nano-particles, in this example elongate nano-particles P such as nano-rods, dispersed in the polymeric matrix PM and generally aligned with respect to a longitudinal axis L and their respective longitudinal axis. Such a material is indicated by diagonal shading of the spacer and wall features illustrated in FIGS. 1 and 3. It is to be appreciated that FIG. 4 is not drawn to scale and that the illustrated nano-particles are not representative of actual size or dimensions.

With this alignment of elongate nano-particles, a resist structure comprising such a nano-filler can have anisotropic mechanical properties. For example, a stiffness of the resist structure may be greater in a direction coincident or parallel with an axis relative to which each longitudinal axis of the elongate nano-particles is generally aligned with respect to. Therefore, if the longitudinal axis of each elongate nano-particle is generally aligned with a longitudinal axis of the resist structure, coincident with the length of the resist structure, a longitudinal stiffness of the resist structure may be greater than a lateral stiffness of the resist structure along a lateral axis perpendicular to the longitudinal axis of the resist structure.

Thus, a resist structure such as a wall or spacer can be stiffer than in known electrowetting elements and therefore more resistant to any compressive forces applied externally to support plates of the electrowetting element, which would tend to deform the support plates. It is acknowledged that for example nano-filler comprising for example any of nano-silica, nanoalumina or nanozirconia are useful in examples for providing such a stiffer resist structure.

In some examples a longitudinal stiffness of the resist structure, taken along a longitudinal axis of the resist structure, is in the range 3 to 12 giga Pascals (GPa) for the Young's Modulus, when taken for example at a room temperature of 25 degrees Celsius.

The stiffness and also strength of the resist structure will depend not only on the material from which it is formed, but also on its dimensions and shape. For example, a spacer with a larger surface area in contact with a wall may be stronger against compressive forces than a spacer with a smaller such surface area. In examples, a resist structure such as a spacer or a wall described herein has a longitudinal dimension along a longitudinal axis extending between the support plates. A wall has for example a longitudinal dimension of 1 to 10 micrometers and a spacer has for example a longitudinal dimension of 1 to 25 micrometers, for example 8 to 12 micrometers.

In addition to the improved stiffness properties of such a resist structure, using a polymer nanocomposite material, such a resist structure may also have desirable optical transparency properties for visible light, for example by being substantially transparent to visible light. Typically therefore the resist structure transmits more than 90% of visible light. Hence, the presence of the nano-filler in the polymer may not sufficiently degrade light transmission properties of a spacer or a wall. In some examples, the nanocomposite material in resist structure may be used to color the resist structure, or to render the resist structure black and substantially absorbing of all parts of the optical spectrum, for example the visible spectrum.

Moreover, in some examples, such a resist structure formed using a polymer nanocomposite material may have a first refractive index which is substantially equal (e.g. within acceptable measuring tolerances) to a refractive index of the first fluid (in other words a first fluid refractive index) and/or to a refractive index of the second fluid (in other words a second fluid refractive index). Hence, using the nano-filler in the polymer may not degrade the refractive index properties of a spacer or a wall.

Although the walls in FIG. 1 are shown as structures protruding from the insulating layer 13, they may instead be a surface layer of the support plate that repels the first fluid, such as a hydrophilic or less hydrophobic layer. For example, the walls may have a height of substantially zero on the surface of the insulating layer, with the height being taken in a direction perpendicular to a plane of the first support plate. Typically, substantially zero in examples refers to a height which is minimal, for example as close to zero within acceptable manufacturing tolerances, whilst providing a reduced hydrophobicity.

With a surface 36 of the spacer 26 contacting a surface of a wall, a deformation such as an extent the first and second support plates may be displaced or deformed relative to each other, may be reduced, as the spacer gives structural support between the support plates thereby improving the robustness of the display device.

The polymer nanocomposite material of the resist structure may be selected to have a wettability of a surface of the resist structure with a surface free energy of 50, greater than 50 or in the range 50 to 60 Joules per meter squared ($J/m^2$). Where the resist structure is a spacer the surface wettability is for example hydrophilic with a surface free energy of greater than 50 $J/m^2$ and where the resist structure is for example a wall the surface free energy is for example 50 to 60 $J/m^2$. This may be measured by measuring a contact angle of a liquid on the surface, as the skilled person will appreciate.

In the examples described above with reference to FIGS. 1 to 2, the surface of the spacer contacts at least part of a wall. However, in other examples, at least one of the first support plate or the second support plate are formed of a material which with sufficient force may be deformed. With such a deformation of the at least one of the first support plate or the second support plate, the spacer is movable towards the wall to contact the wall surface which at least partly overlaps the surface of the spacer. In these examples, the spacer may not contact the wall unless at least one of the support plates is deformed. Such an example is shown in FIG. 3. Features are illustrated in FIG. 3 which are similar to those of FIGS. 1 to 4; the same reference numerals are used and corresponding descriptions apply.

In FIG. 3, the length 44 of the spacer 40 in a direction perpendicular to the plane of the display area 24 is less than the distance 46 between a part of the second support plate 6 which does not form the spacer 40 and the wall surface 34 in the same direction. In this example, the spacer 40 is not in contact with the wall surface 34 when the first support plate 5 and the second support plate 6 are not deformed, but the spacer 40 and the wall surface 34 may contact each other with sufficient deformation of the plates. However, when at least one of the first support plate 5 and the second support plate 6 are deformed relative to each other, the distance between the second support plate 6 and the wall surface 34 (which forms part of the first support plate 5) may be reduced. A deformation may be a bending of one or both of the support plates or a movement or displacement of a part or all of one or both of the support plates, for example due to the application of pressure, such as the pressure exerted by a finger or hand, on one or both of the support plates.

When one or both of the first and second support plates is deformed relative to each other such that the distance between the support plates is reduced, the spacer 40 is moved towards the wall surface 34. The movement of the spacer 40 may be due to a movement of the second support plate 6 and hence the spacer 40 itself (which is part of the second support plate 6). Alternatively, the spacer 40 may remain stationary and the first support plate 5 may move towards the surface 42 of the spacer 40, thereby reducing the distance between the first and second support plates 5 and 6. In further examples, both the first support plate 5 and the second support plate 6 are deformed so that both the spacer 40 and the wall surface 34 move towards each other.

When the distance between the second support plate 6 and the spacer contact surface 34 is reduced to a distance substantially equal to the length 44 of the spacer 40 in a direction perpendicular to a plane of the first display area 24, the surface 42 of the spacer 40 will contact the wall surface 34. If further pressure is applied to one or both of the support plates once the spacer 40 is in contact with the wall surface 34, the contact between the spacer 40 and the wall surface 34 will prevent the support plates from being deformed further, maintaining the distance between the first support plate 5 and the second support plate 6 at a distance substantially equal to the length 44 of the spacer 40.

In the example shown in FIG. 3, a width of the wall is greater than a width of the spacer, to improve the amount of contact between the spacer and wall when the support plates are sufficiently deformed. In other examples the wall width may be less, for example with a similar or the same width as the spacer.

A resist structure in accordance with examples described herein may be formed using for example a lithography process, where for example the polymer of a polymer nanocomposite material is a photoresist polymer. This may for example be part of a method of manufacturing a support plate of an electrowetting element, such as that of FIG. 1. The support plate may therefore be a first support plate or a second support plate as for example described above.

Figure 5:
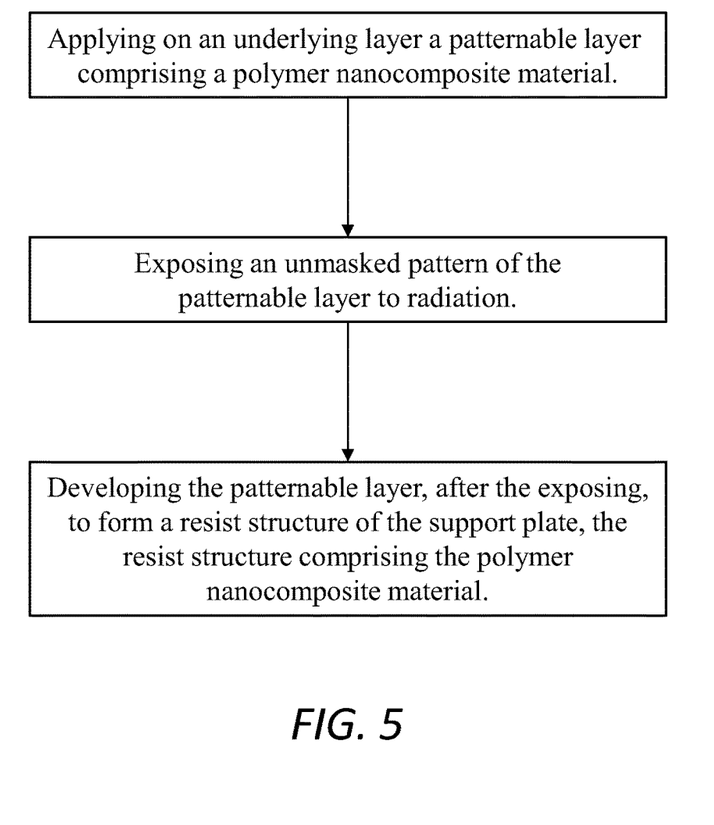
FIG. 5 illustrates part of a method of manufacturing a support plate according to examples.

In accordance with examples, such a method is now described with reference to FIG. 5.

In such a method, a patternable layer is for example applied on an underlying layer. In the case that the method is for forming a spacer as the resist structure, the underlying layer is for example the second substrate describer earlier. In an alternative case that the method is for forming a wall as the resist structure, the underlying layer is for example a hydrophobic layer as described earlier, which may be part of a partly assembled first support plate with further underlying layers, such as a barrier layer and an electrode.

Before applying the patternable layer on the underlying layer, a surface of the underlying layer may be prepared or treated to improve an adhesion with the patternable layer. Where the underlying layer is the hydrophobic layer, such treatment may include a reactive ion etching (RIE) process which the skilled person will readily appreciate will clean the surface of the underlying layer. A priming step may then in some examples be performed, to for example apply an adhesion promoter to improve adhesion of the patternable layer; in such examples a layer of adhesion promoter or primer may be considered to be the underlying layer.

The patternable layer is then applied. The patternable layer comprises a polymer nanocomposite material for example such as that described in examples above, and dissolved in a suitable solvent. This material may for example be hardened by exposure to radiation in the range 350 to 450 nanometers, and have a transparency to such radiation of at least 80%, to ensure that during the exposing step sufficient cross-linking occurs. The patternable layer may for example be applied, for example dispensed or deposited, as a liquid using a spin coating process well known to the person skilled in the art, where a quantity of liquid is applied to the underlying layer, which underlying layer is spun to evenly coat the underlying layer with the patternable layer.

The applied patternable layer may then be heated, otherwise referred to as prebaked, to evaporate solvent in the patternable layer.

A mask with apertures corresponding to a pattern to be formed by the patternable layer is then used during an exposing step of the method. In this step, an unmasked pattern of the patternable layer is exposed to radiation. In other words, the apertures of the mask correspond with unmasked portions of the pattern through which radiation passes to reach and expose unmasked portions of the patternable layer to the radiation (e.g. ultraviolet radiation). Therefore, masked portions of the patternable layer are not exposed to the radiation. Depending on the composition of the material of the patternable layer, exposure to radiation may either strengthen or weaken the material of the patternable layer to a later developing step. In the example where the polymer of the photoresist is SU-8 or KMPR, the photoresist is a so-called negative photoresist where the unmasked portions of the patternable layer are strengthened, for example by curing of an epoxy resin compound of the polymer, against the later development step. It is desirable to for example fully complete the exposing step, to enable maximum or sufficiently high cross linking to occur within the polymer nanocomposite material, such that nano-filler material or polymer does not leak out of the resist structure once part of the electrowetting element.

After the exposing, the patternable layer is developed to form a resist structure such as the spacer or wall described in examples herein. By the developing, and depending on whether the photoresist is a positive or negative type, the unmasked portions of the patternable layer may be removed or remain, to form a patterned layer including the resist structure comprising the polymer nanocomposite material. Where the polymer is SU-8 a solvent based developer is used, for example 1-methoxy-2-propanol acetate. Where instead the polymer is KMPR, or another suitable photoresist polymer, the developer is for example tetramethylaminehydroxide (TMAH) which is alkaline.

A further heating or post baking step may be performed, for example to evaporate any remaining developer and/or remaining photoresist solvent.

The skilled person will readily appreciate conditions such as temperature, durations of method steps, and radiation wavelengths and powers for a suitable lithography method such as those described here. It is noted that in examples with the patternable layer comprising a polymer nanocomposite material, a nano-filler material may be appropriately chosen in the polymer so that a known lithography method may be used. Therefore, despite using a polymer nanocomposite material for the patternable layer, for forming the resist structure, no significant deviation from known lithography techniques may be required.

After forming the resist structure, for example a wall and/or a spacer, the electrowetting element may be further assembled, for example by dispensing the first fluid on the surface of the display area, dispensing the second fluid and positioning the first and second support plates with a spaced relationship between them, with the first and second fluids between the plates, and in some examples with the spacer in contact with the wall for example in accordance with FIG. 1.

In some examples, where the polymer nanocomposite comprises elongate nano-particles, these nano-particles may be generally aligned with other in respect of their longitudinal axes during the lithography process. For example, once the patternable layer has been applied, and before the exposing, an alignment technique may be used as will be appreciated by one of skill in the art. Such a technique may include at least one of applying an electric, optical or magnetic field to align the elongate nano-particles, depending on the specific properties of the nano-particles.

In further examples, it is envisaged that instead of a lithography technique, any of: a printing process, such as inkjet printing or off-set printing, or a nano-embossing technique may be used to form the resist structure.

Figure 6:
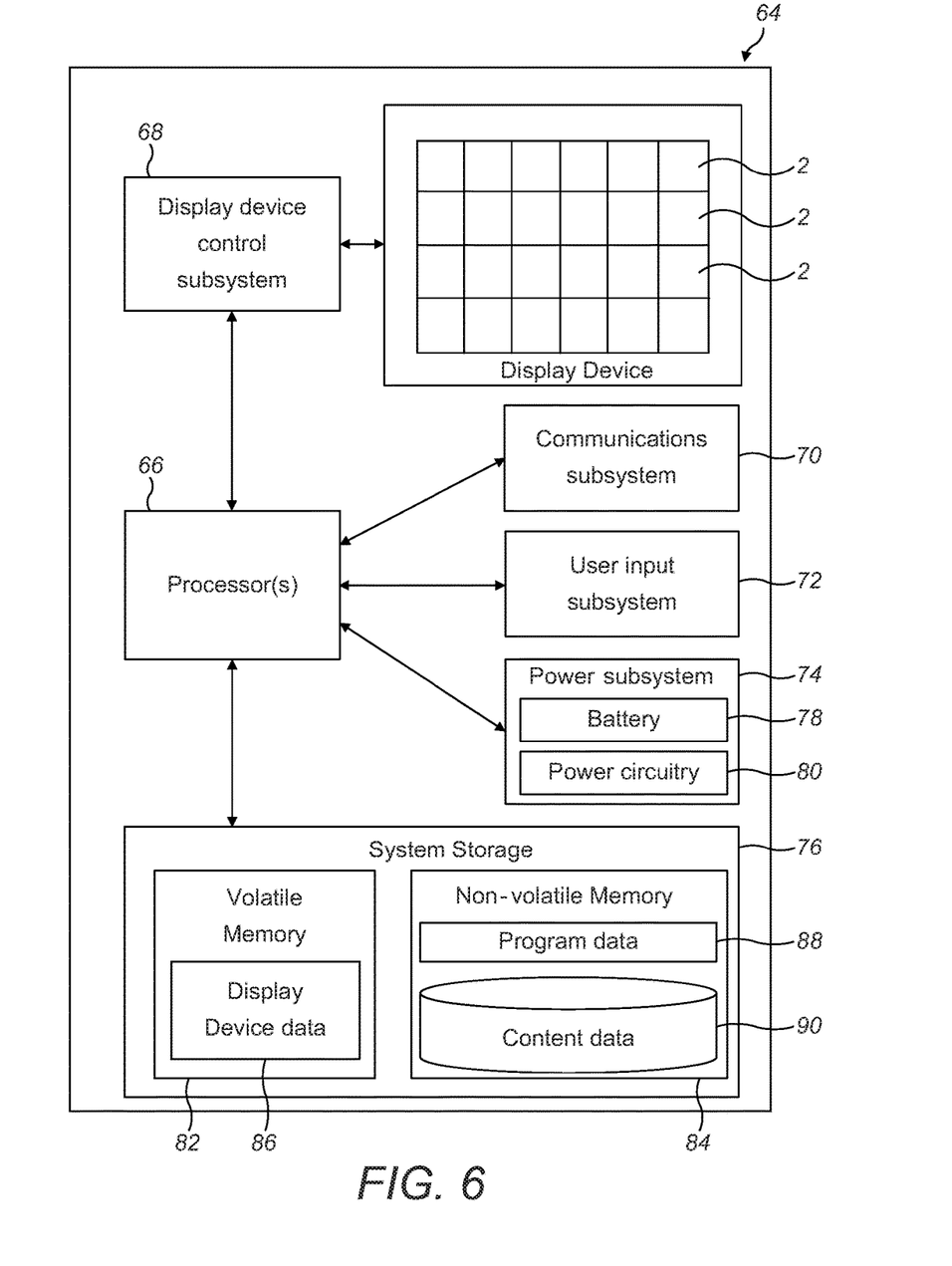
FIG. 6 illustrates apparatus including the electrowetting element of examples described herein.

FIG. 6 shows schematically a system diagram of an example system, for example apparatus 64, comprising an electrowetting display device such as the electrowetting display device 1 described above with reference to FIG. 1 comprising electrowetting elements 2, although the system of FIG. 6 can be used with any of the example electrowetting elements described above. The apparatus is for example a portable, e.g. mobile, device such as an electronic reader device such as a so-called e-reader, a tablet computing device, a laptop computing device, a mobile telecommunications device, a watch or a satellite navigation device; the apparatus may alternatively be a display screen for installation in any machine or device requiring a display screen, for example a consumer appliance.

The system diagram illustrates an example of a basic hardware architecture of the apparatus 64. The apparatus includes at least one processor 66 connected to and therefore in data communication with for example: a display device control subsystem 68, a communications subsystem 70, a user input subsystem 72, a power subsystem 74 and system storage 76. The display device control subsystem is connected to and is therefore in data communication with the display device 1. The at least one processor 66 is for example a general purpose processor, a microprocessor, a digital signal processor (DSP), an application specific integrated circuit (ASIC), a field programmable gate array (FPGA) or other programmable logic device, a discrete gate or transistor logic, discrete hardware components, or any suitable combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration. The processor may be coupled, via one or more buses, to read information from or write information to one or more memories, for example those of the system storage 76. The at least one processor may additionally, or in the alternative, contain memory, such as processor registers.

The display device control subsystem 68 for example includes electrowetting element driver components, for use in applying a voltage to any of the electrowetting elements, to address different such display elements. In examples the electrowetting elements are configured according to an active matrix configuration and the display device control subsystem is configured to control switching elements such as thin film transistors (TFTs) of the display device 1 via circuitry to control the electrowetting elements. The circuitry may include signal and control lines such as those described above.

The communications subsystem 70 for example is configured for the apparatus to communicate with for example a computing device via a data network, for example a computer network such as the Internet, a local area network, a wide area network, a telecommunications network, a wired network, a wireless network, or some other type of network. The communications subsystem 70 may further for example comprise an input/output (I/O) interface, such as a universal serial bus (USB) connection, a Bluetooth or infrared connection, or a data network interface for connecting the apparatus to a data network such as any of those described above. Content data as described later may be transferred to the apparatus via the communications subsystem.

The user input subsystem 72 may include for example an input device for receiving input from a user of the apparatus. Example input devices include, but are not limited to, a keyboard, a rollerball, buttons, keys, switches, a pointing device, a mouse, a joystick, a remote control, an infrared detector, a voice recognition system, a bar code reader, a scanner, a video camera (possibly coupled with video processing software to, e.g., detect hand gestures or facial gestures), a motion detector, a microphone (possibly coupled to audio processing software to, e.g., detect voice commands), or other device capable of transmitting information from a user to the device. The input device may also take the form of a touch-screen associated with the display device, in which case a user responds to prompts on the display device by touch. The user may enter textual information through the input device such as the keyboard or the touch-screen.

The apparatus may also include a user output subsystem (not illustrated) including for example an output device for providing output to a user of the apparatus. Examples include, but are not limited to, a printing device, an audio output device including for example one or more speakers, headphones, earphones, alarms, or haptic output devices. The output device may be a connector port for connecting to one of the other output devices described, such as earphones.

The power subsystem 74 for example includes power circuitry 80 for use in transferring and controlling power consumed by the apparatus. The power may be provided by a mains electricity supply or from a battery 78, via the power circuitry. The power circuitry may further be used for charging the battery from a mains electricity supply.

The system storage 76 includes at least one memory, for example at least one of volatile memory 82 and non-volatile memory 84 and may comprise a non-transitory computer readable storage medium. The volatile memory may for example be a Random Access Memory (RAM). The non-volatile (NV) memory may for example be a solid state drive (SSD) such as Flash memory, or Read Only Memory (ROM). Further storage technologies may be used, for example magnetic, optical or tape media, compact disc (CD), digital versatile disc (DVD), Blu-ray or other data storage media. The volatile and/or non-volatile memory may be removable or non-removable.

Any of the memories may store data for controlling the apparatus, for example components or subsystems of the apparatus. Such data may for example be in the form of computer readable and/or executable instructions, i.e. computer program instructions. Therefore, the at least one memory and the computer program instructions may be configured to, with the at least one processor, control a display effect provided by the electrowetting display device.

In the example of FIG. 6, the volatile memory 82 stores for example display device data 86 which is indicative of display effects to be provided by the display device 1. The processor 66 may transmit data, based on the display device data, to the display device control subsystem 68 which in turn outputs signals to the display device for applying voltages to the display elements, for providing display effects from the display device. The non-volatile memory 84 stores for example program data 88 and/or content data 90. The program data is for example data representing computer executable instructions, for example in the form of computer software, for the apparatus to run applications or program modules for the apparatus or components or subsystems of the apparatus to perform certain functions or tasks, and/or for controlling components or subsystems of the apparatus. For example, application or program module data includes any of routines, programs, objects, components, data structures or similar. The content data is for example data representing content for example for a user; such content may represent any form of media, for example text, at least one image or a part thereof, at least one video or a part thereof, at least one sound or music or a part thereof. Data representing an image or a part thereof is for example representative of a display effect to be provided by at least one electrowetting element of the electrowetting display device. The content data may include data representing a library of content, for example a library of any of books, periodicals, newspapers, movies, videos, music, or podcasts, each of which may be represented by a collection of data which represents for example one book or one movie. Such a collection of data may include content data of one type, but may instead include a mixture of content data of different types, for example a movie may be represented by data including at least image data and sound data.

The above examples are to be understood as illustrative examples. Further examples are envisaged. For example, certain shapes and forms of resist structure s have been described, for example a spacer and a wall. It is envisaged that in further examples the shape and form of a resist structure may be different from that described above, for example the spacer may be shaped with a tapering shape and may have different relative proportions than the examples described herein. Moreover, in examples, the resist structure may be entirely formed from a polymer nanocomposite material, but in other examples may also comprise other materials too in addition to the polymer nanocomposite material. In further envisaged examples, nano-particles of the polymer nanocomposite material may be coated to further influence properties of the polymer nanocomposite material, for example to enhance adhesion of the nano-particles within the polymer matrix. Furthermore, examples are envisaged with a resist structure which is not a spacer or a wall which is at least partly formed of a nanocomposite material described in examples herein; such a resist structure may be a ridge or a banked structure or other raised structure of one of the support plates.

It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the accompanying claims.

What is claimed is:
1. An electrowetting element comprising:
a first fluid;
a second fluid immiscible with the first fluid;
a first support plate comprising:
 a first substrate;
 an electrode; and
 a layer in contact with at least one of the first fluid or the second fluid; and
a second support plate comprising a second substrate,
one of the first support plate or the second support plate comprising a resist structure protruding in a direction towards the other one of the first support plate or the second support plate,
the resist structure comprising a polymer nanocomposite material, and
the resist structure having a longitudinal axis in the direction towards the other one of the first support plate or the second support plate, wherein a longitudinal stiffness of the resist structure along the longitudinal axis is in the range 3 to 12 GPa and is greater than a lateral stiffness of the resist structure along a lateral axis perpendicular the longitudinal axis.

2. The electrowetting element according to claim 1, wherein the polymer nanocomposite material comprises a nano-filler material dispersed in a photoresist polymer.

3. The electrowetting element according to claim 1, wherein the polymer nanocomposite material comprises a nano-filler material dispersed in an epoxy resin.

4. The electrowetting element according to claim 1, wherein the polymer nanocomposite material comprises elongate nano-particles dispersed in a polymer.

5. The electrowetting element according to claim 4, the elongate nano-particles each having a longitudinal axis and each being generally aligned with the respective longitudinal axis of each of the elongate nano-particles.

6. The electrowetting element according to claim 1, wherein the polymer nanocomposite material comprises one or more of: nanotubes or nanofibers.

7. The electrowetting element according to claim 1, wherein the polymer nanocomposite material comprises at least one of: a nano metal oxide, titanium dioxide, nano-silica, nanoalumina, nanozirconia, carbon nanotubes, nano-clays, a phyllosilicate, a polysilicate, nanosilver, nanozinc, or nanogold.

8. The electrowetting element according to claim 1, wherein a wettability of a surface of the resist structure has a surface free energy of 50, greater than 50, or in the range 50 to 60 J/m2.

9. The electrowetting element according to claim 1, wherein the polymer nanocomposite material has a first refractive index substantially equal to at least one of a first fluid refractive index of the first fluid or a second fluid refractive index of the second fluid.

10. The electrowetting element according to claim 1, wherein the polymer nanocomposite material comprises 30% to 90% by volume of nano-filler material.

11. The electrowetting element according to claim 1, wherein a dimension of the resist structure along the longitudinal axis is 1 to 10 micrometers, 1 to 25 micrometers, or 8 to 12 micrometers.

12. The electrowetting element according to claim 1, wherein the resist structure comprises a spacer protruding from the second support plate.

13. The electrowetting element according to claim 1, wherein the resist structure comprises a wall protruding from the first support plate and bounding at least part of a perimeter of a first support plate surface in contact with at least one of the first fluid or the second fluid.

14. A method of manufacturing a support plate of an electrowetting element comprising:
   applying on an underlying layer a patternable layer comprising a polymer nanocomposite material;
   exposing an unmasked pattern of the patternable layer to radiation;
   developing the patternable layer, after the exposing, to form a resist structure of the support plate, the resist structure comprising the polymer nanocomposite material, and
   the resist structure having a longitudinal axis, wherein a longitudinal stiffness of the resist structure along the longitudinal axis is in the range 3 to 12 GPa and is greater than a lateral stiffness of the resist structure along a lateral axis perpendicular the longitudinal axis.

15. The method according to claim 14, further comprising: generally aligning respective longitudinal axes of elongate nano-particles of the polymer nanocomposite material, the respective longitudinal axes generally aligned with the longitudinal axis.

16. The method according to claim 14, wherein the polymer nanocomposite material comprises at least one of: a nano metal oxide, titanium dioxide, nanosilica, nanoalumina, nanozirconia, carbon nanotubes, nanoclays, a phyllosilicate, a polysilicate, nanosilver, nanozinc, or nanogold.

17. An apparatus comprising:
   an electrowetting element comprising:
      a first fluid;
      a second fluid immiscible with the first fluid;
      a first support plate comprising:
         a first substrate;
         an electrode; and
         a layer in contact with at least one of the first fluid or the second fluid; and
      a second support plate comprising a second substrate,
      one of the first support plate or the second support plate comprising a resist structure protruding in a direction towards the other one of the first support plate or the second support plate, the resist structure comprising a polymer nanocomposite material, and
   the resist structure having a longitudinal axis in the direction towards the other one of the first support plate or the second support plate, wherein a longitudinal stiffness of the resist structure along the longitudinal axis is in the range 3 to 12 GPa and is greater than a lateral stiffness of the resist structure along a lateral axis perpendicular the longitudinal axis;
   at least one processor; and
   at least one memory including computer program instructions, the at least one memory and the computer program instructions being configured to, with the at least one processor, control switching of the first fluid and the second fluid between:
      a first configuration with a zero voltage applied between the electrode and the second fluid, and
      a second configuration.

18. The apparatus according to claim 17, wherein the polymer nanocomposite material comprises elongate nano-particles dispersed in a polymer, the elongate nano-particles each having a longitudinal axis and each being generally aligned with the respective longitudinal axis of each of the elongate nano-particles.

19. The apparatus according to claim 17, wherein the polymer nanocomposite material comprises at least one of: a nano metal oxide, titanium dioxide, nanosilica, nanoalumina, nanozirconia, carbon nanotubes, nanoclays, a phyllosilicate, a polysilicate, nanosilver, nanozinc, or nanogold.

20. The apparatus of claim 17, wherein the resist structure comprises:
   a spacer protruding from the second support plate; or
   a wall protruding from the first support plate and bounding at least part of a perimeter of a first support plate surface in contact with at least one of the first fluid or the second fluid.

* * * * *

UNITED STATES PATENT AND TRADEMARK OFFICE
CERTIFICATE OF CORRECTION

PATENT NO. : 10,054,785 B1
APPLICATION NO. : 14/980872
DATED : August 21, 2018
INVENTOR(S) : Fischer et al.

Page 1 of 1

It is certified that error appears in the above-identified patent and that said Letters Patent is hereby corrected as shown below:

On the Title Page

In Item (72), under "Inventors", in Column 1, Line 1, delete "Iren" and insert -- Irén --, therefor.

In Item (56), under "OTHER PUBLICATIONS", in Column 2, Line 2, delete "Modem" and insert -- Modern --, therefor.

Signed and Sealed this
Sixteenth Day of April, 2019

Andrei Iancu
*Director of the United States Patent and Trademark Office*